(12) United States Patent
Hong et al.

(10) Patent No.: US 7,235,823 B2
(45) Date of Patent: Jun. 26, 2007

(54) SOURCE SIDE INJECTION STORAGE DEVICE WITH SPACER GATES AND METHOD THEREFOR

(75) Inventors: Cheong M. Hong, Austin, TX (US); Gowrishankar L. Chindalore, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 11/536,099

(22) Filed: Sep. 28, 2006

(65) Prior Publication Data
US 2007/0020849 A1    Jan. 25, 2007

Related U.S. Application Data

(62) Division of application No. 11/170,447, filed on Jun. 29, 2005, now Pat. No. 7,132,329.

(51) Int. Cl.
*H01L 29/788* (2006.01)
(52) U.S. Cl. ............ 257/213; 257/315; 257/316; 257/320; 257/E21.691
(58) Field of Classification Search ............ 257/213, 257/314, 315, 316, 319, 320
See application file for complete search history.

(56) References Cited

U.S. PATENT DOCUMENTS

| | | | |
|---|---|---|---|
| 6,133,098 A | 10/2000 | Ogura et al. | |
| 6,160,287 A | 12/2000 | Chang | |
| 6,373,096 B1 | 4/2002 | Hisamune et al. | |
| 6,400,610 B1 | 6/2002 | Sadd | |
| 6,687,156 B2 | 2/2004 | Kobayashi et al. | |
| 6,699,753 B2 * | 3/2004 | Ma et al. ............ | 438/257 |
| 6,803,276 B2 * | 10/2004 | Kim et al. ............ | 438/257 |
| 6,992,349 B2 | 1/2006 | Lee et al. | |
| 7,195,964 B2 * | 3/2007 | Ding ............ | 438/201 |
| 2002/0028541 A1 | 3/2002 | Lee et al. | |
| 2003/0080372 A1 | 5/2003 | Mikolajick | |
| 2004/0121540 A1 | 6/2004 | Lin | |
| 2005/0218522 A1 | 10/2005 | Nomoto et al. | |
| 2005/0243603 A1 | 11/2005 | Kobayashi et al. | |
| 2006/0018164 A1 | 1/2006 | Wu | |
| 2006/0076586 A1 | 4/2006 | Swift et al. | |
| 2006/0076606 A1 | 4/2006 | Lojek | |
| 2006/0076609 A1 | 4/2006 | Chindalore et al. | |
| 2006/0079051 A1 | 4/2006 | Chindalore et al. | |
| 2006/0079455 A1 | 4/2006 | Gazit et al. | |
| 2006/0086967 A1 * | 4/2006 | Hsieh et al. ............ | 257/314 |
| 2006/0086970 A1 | 4/2006 | Kim | |

* cited by examiner

*Primary Examiner*—Michael Trinh
(74) *Attorney, Agent, or Firm*—Robert L. King; James L. Clingan, Jr.

(57) ABSTRACT

A storage device structure (10) has two bits of storage per control gate (34) and uses source side injection (SSI) to provide lower programming current. A control gate (34) overlies a drain electrode formed by a doped region (22) that is positioned in a semiconductor substrate (12). Two select gates (49 and 50) are implemented with conductive sidewall spacers adjacent to and lateral to the control gate (34). A source doped region (60) is positioned in the semiconductor substrate (12) adjacent to one of the select gates for providing a source of electrons to be injected into a storage layer (42) underlying the control gate. Lower programming results from the SSI method of programming and a compact memory cell size exists.

20 Claims, 5 Drawing Sheets

SOURCE SIDE INJECTION STORAGE DEVICE WITH SPACER GATES AND METHOD THEREFOR

This application is a Divisional of U.S. Ser. No. 11/170,447, filed Jun. 29, 2005 now U.S. Pat. No. 7,132,329.

RELATED APPLICATIONS

This application is related to our copending U.S. patent applications filed of even date and assigned to the assignee hereof:
(1) "Source Side Injection Storage Device and Method Therefor", Ser. No. 11/170,444 by Chindalore; and
(2) "Source Side Injection Storage Device With Control Gates Adjacent To Shared Source/Drain and Method Therefor", Ser. No. 11/170,446 by Hong et al.

FIELD OF THE INVENTION

This invention relates to non-volatile memories, and more particularly to storage devices in the non-volatile memories that use source side injection.

BACKGROUND OF THE INVENTION

Source side injection (SSI) has been found to have benefits over regular hot carrier injection (HCI) used in the programming of non-volatile memories (NVMs). Programming by SSI is able to be performed at significantly lower power than programming by regular (HCI). This is particularly important in uses such as cell phones in which battery operation is very important. One of the disadvantages of SSI is that the storage devices require more area on the integrated circuit which increases cost. The design of the individual memory cells for SSI generally includes a transition in the gate structure over the channel which requires more area.

One of the techniques in the attempt to reduce the impact of the increased storage-device size has been the use of a virtual ground array (VGA) architecture. VGA has been known to require relatively small area compared to other architectures while increasing other difficulties such as read disturb. This has nonetheless been a popular architecture for low cost NVMs. Further reductions in space in the storage cell would further reduce size and thus cost.

BRIEF DESCRIPTION OF THE DRAWINGS

The foregoing and further and more specific objects and advantages of the invention will become readily apparent to those skilled in the art from the following detailed description of a preferred embodiment thereof taken in conjunction with the following drawings.

DETAILED DESCRIPTION OF THE INVENTION

In one aspect a storage device has a control gate that is shared by two memory cells. A drain for both memory cells is a first doped region directly under the control gate. The control gate, in the channel direction, covers this doped region. The source is a second doped region and is disposed away from the shared control gate of the given memory cell. The second doped region or source is shared by an adjacent memory cell that has a different control gate. A select gate of the given memory cell is formed as a conductive spacer adjacent to and insulated from the control gate. This structure provides for reduced area while retaining the ability to perform programming by source side injection (SSI). This brief characterization is better understood by reference to the drawings and the following description.

Figure 1:
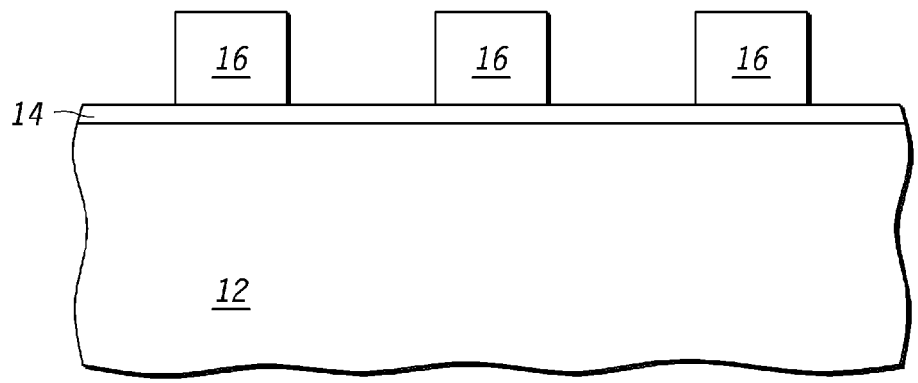
FIG. 1 is a cross section of a storage device structure at a stage in processing according to one embodiment.

Illustrated in FIG. 1 is a storage device structure 10 having a semiconductor substrate 12, a silicon oxide layer 14 on semiconductor substrate 12, and a plurality of patterned silicon nitride regions 16 on silicon oxide layer 14. In one form silicon oxide layer 14 is 50-100 Angstroms thick, but it should be understood that various dimension geometries may be used and that semiconductor processing dimensions are continually shrinking. Patterned silicon nitride regions 16 are, in one form, about 1000 Angstroms thick, about 1500 Angstroms wide, and about 1500 Angstroms apart. It should be understood that these dimensions are exemplary only and other dimensions, including much smaller dimensions, may be used. Additionally, these layers may run for a comparatively long length, for example the length of a memory array. Semiconductor substrate 12 is preferably silicon but could be another semiconductor material, such as germanium, gallium arsenide, silicon on insulator (SOI) and other semiconductor materials.

Figure 2:
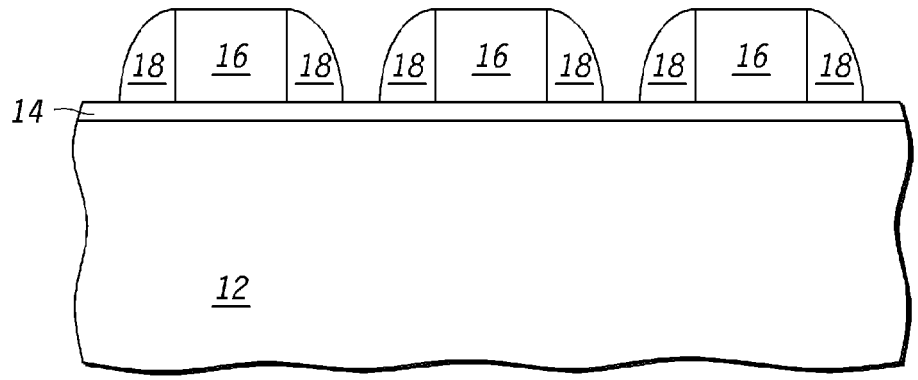
FIG. 2 is a cross section of the storage device structure of FIG. 1 at a subsequent stage in processing.

Illustrated in FIG. 2 is storage device structure 10 after formation of removable sidewall spacers 18 around patterned silicon nitride regions 16. The formation of sidewall spacers is conventional and therefore will not be further detailed. For example, removable sidewall spacers 18 in one form are deposited using a blanket deposition and etch but may also be formed by epitaxial growth.

Figure 3:
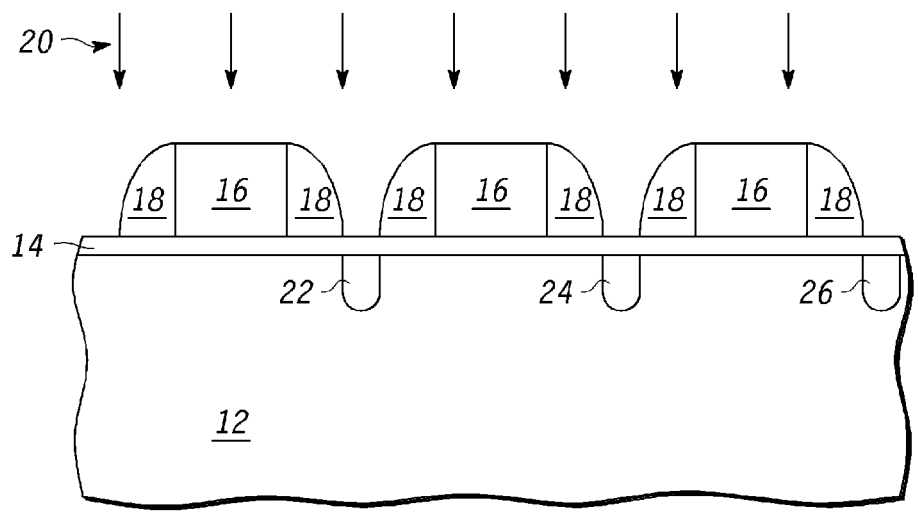
FIG. 3 is a cross section of the storage device structure of FIG. 2 at a subsequent stage in processing.

Illustrated in FIG. 3 is storage device structure 10 after an ion implant 20 to form doped regions 22, 24, and 26 between patterned silicon nitride regions 16 as masked by removable sidewall spacers 18. Doped regions 22, 24, and 26 are preferably doped to N-type to a depth for use as a source/drain. The N-type doping can be achieved using phosphorus or arsenic. It should be understood that other known doping chemistries may be used in lieu of either of these two materials. For P-channel operation, doped regions 22, 24, and 26 can be doped to P-type instead of N-type.

Figure 4:
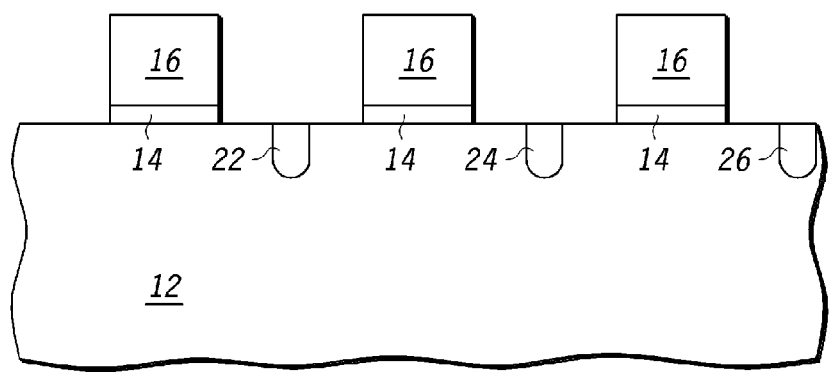
FIG. 4 is a cross section of a storage device structure of FIG. 3 at a subsequent stage.

Illustrated in FIG. 4 is storage device structure 10 after removal of the removable sidewall spacers 18 has occurred.

Additionally, the portion of silicon oxide layer 14 between the nitride layers is removed. This removal can be achieved in various conventional ways such as with a wet HF etch which is highly selective between nitride and oxide.

Figure 5:
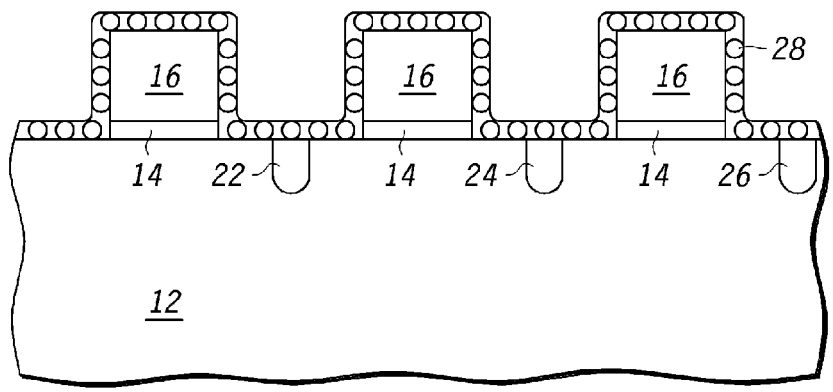
FIG. 5 is a cross section of the storage device structure of FIG. 4 at a subsequent stage in processing.

Illustrated in FIG. 5 is storage device structure 10 after forming a layer of storage material. In the illustrated form a storage layer 28 is formed comprising an atomic layer of nanoclusters or nanocrystals in a dielectric. Materials used for the nanocrystals are silicon, silicon germanium, germanium and other semiconductor materials, including metal. It should be understood that the nanocrystals may not necessarily be crystalline in composition and thus this term is synonymous with nanoclusters which include non-crystalline materials. Various materials may be used in connection the storage layer 28. For example, storage layer 28 may be implemented as a film of nitride that functions as discrete charge storing traps to store information. Other storage layer materials may also be used. It should also be understood that the thickness of the storage layer 28 may be several atoms in thickness or greater as opposed to a single atomic layer thickness. Additionally, the storage layer 28 may not necessarily be planar.

Figure 6:
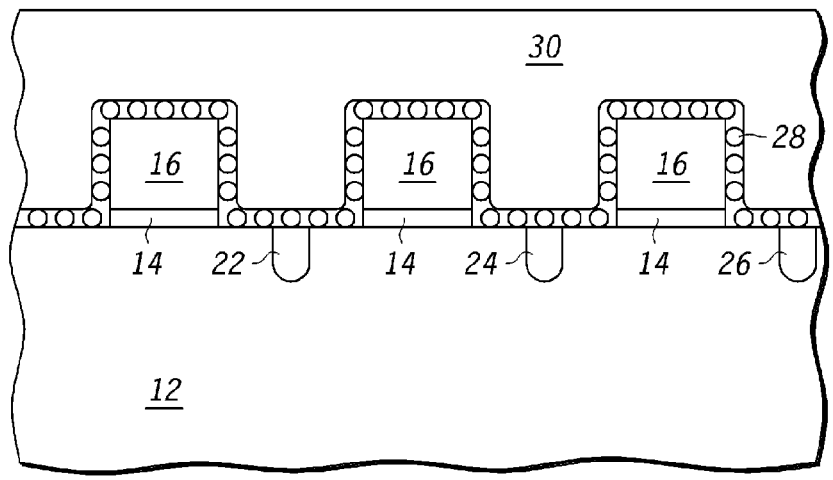
FIG. 6 is a cross section of the storage device structure of FIG. 5 at a subsequent stage in processing.

Illustrated in FIG. 6 is storage device structure 10 after formation of a gate layer 30. The gate layer 30 is shown as a planar layer but it may also be formed as a conformal layer. Gate layer 30 may also be a stack of different conductive layers. Gate layer 30 is conductive. In one form the conductive characteristic is accomplished with a metal that is deposited by plating but could be another conductive material and could be deposited by another method for depositing a layer that can be useful as a gate. For example, gate layer 30 may be implemented as a layer of polysilicon. Various ways to form gate layer 30 exist such as deposition and plating techniques. In the case of plating, a seed layer (not separately shown) is formed before the plating of ultimate gate layer 30. In one form the metal is tungsten but various metals and metal alloys may be used.

Figure 7:
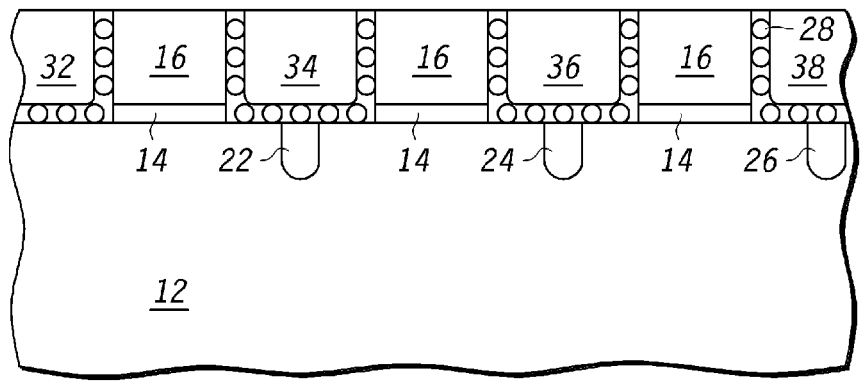
FIG. 7 is a cross section of the storage device structure of FIG. 6 at a subsequent stage in processing.

Illustrated in FIG. 7 is storage device structure 10 after a planarizing process that removes gate layer 30 from over patterned silicon nitride regions 16. The patterning of gate layer 30 forms control gates 32, 34, 36, and 38 between the patterned silicon nitride regions 16. In one form a chemical mechanical polishing (CMP) process using nitride as the etch stop is preferably used for the planarizing. Other planarizing techniques may be used. For example a timed etch process may be used as another etch back process.

Figure 8:
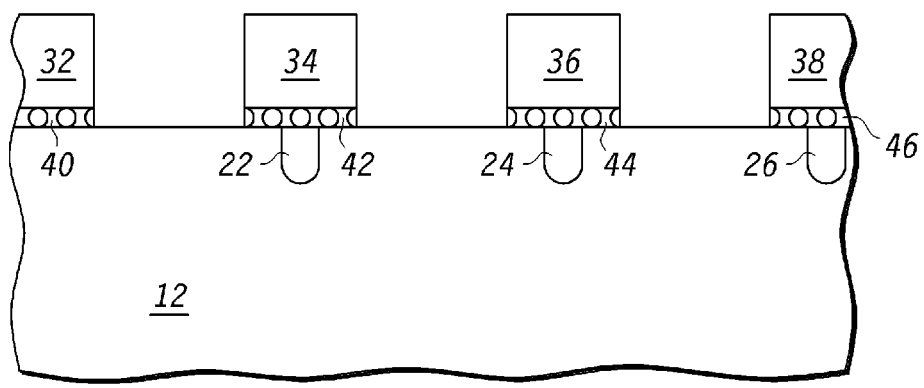
FIG. 8 is a cross section of the storage device structure of FIG. 7 at a subsequent stage in processing.

Illustrated in FIG. 8 is storage device structure 10 after removal of the patterned silicon nitride regions 16 and the underlying remaining portions of silicon oxide layer 14. This removal is achieved by various removal processes. For example, the patterned silicon nitride regions 16 may be removed by using a dry chlorine etch which is commonly used for etching nitride. This dry etch also removes oxide but is selective to silicon. This etch processing leaves control gates 32, 34, 36, and 38 and portions of semiconductor substrate 12 exposed. Another removal process, such as a conventional chemical wet etch may be used. Under control gates 32, 34, 36, and 38 are storage layers 40, 42, 44, and 46, respectively, formed from storage layer 28.

Figure 9:
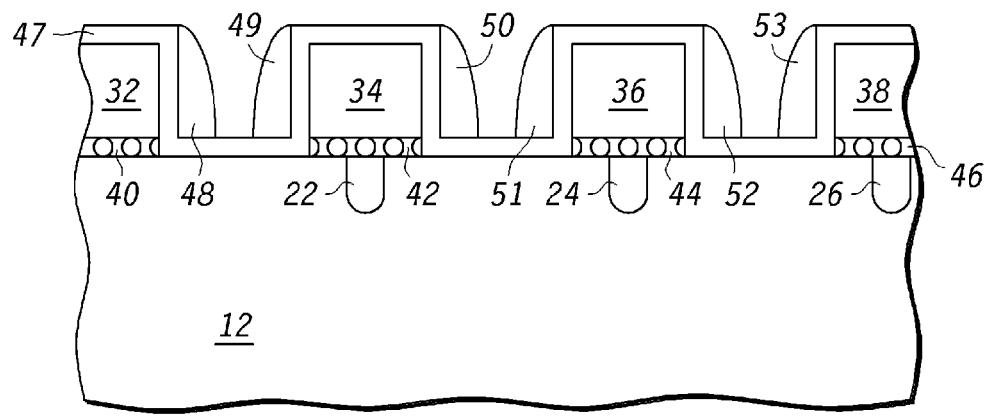
FIG. 9 is a cross section of the storage device structure of FIG. 8 at a subsequent stage in processing.

Illustrated in FIG. 9 is storage device structure 10 after forming an insulating liner 47 on the exposed portions of semiconductor substrate 12 and control gates 32, 34, 36, and 38. After the formation of insulating liner 47, a plurality of conductive sidewall spacers or conductive spacers is formed adjacent and lateral to the control gates. In particular, conductive spacer 48 is formed adjacent to control gate 32, conductive spacers 49 and 50 are formed adjacent to control gate 34, conductive spacers 51 and 52 are formed adjacent to control gate 36, and conductive spacer 53 is formed adjacent to control gate 38. Conductive spacers 48, 49, 50, 51, 52 and 53 are conductive and are preferably formed of polysilicon. It should be understood that other conductive materials, such as metal, may be used.

Figure 10:
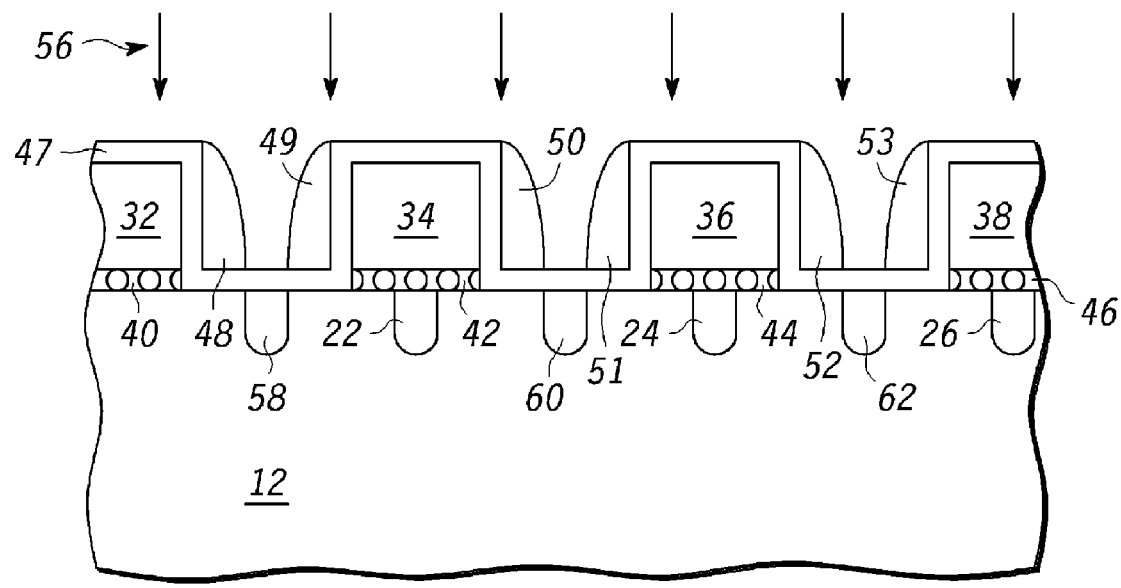
FIG. 10 is a cross section of the storage device structure of FIG. 9 at a subsequent stage in processing.

Illustrated in FIG. 10 is storage device structure 10 after an ion implant 56 forms doped regions 58, 60 and 62 between control gates 32, 34, 36, and 38 using conductive spacers 48, 49, 50, 51, 52 and 53 as a mask. This ion implant is preferably the same as ion implant 20 shown in FIG. 3 but other implant techniques may be used. For example, a different species of ions may be used to optimize the programming efficiency or improve electrical short channel effects associated with the doped regions 58, 60 and 62. It should be noted that the conductive spacers 48, 49, 50, 51, 52 and 53 are permanent spacers as opposed to disposable spacers. Further, the doped regions 58, 60 and 62 will function as either a drain or a source of the storage device structure 10 depending upon either the chosen conductivity of doped regions 58, 60 and 62 or the voltage biasing of the doped regions 58, 60 and 62 that is applied during operation.

Figure 11:
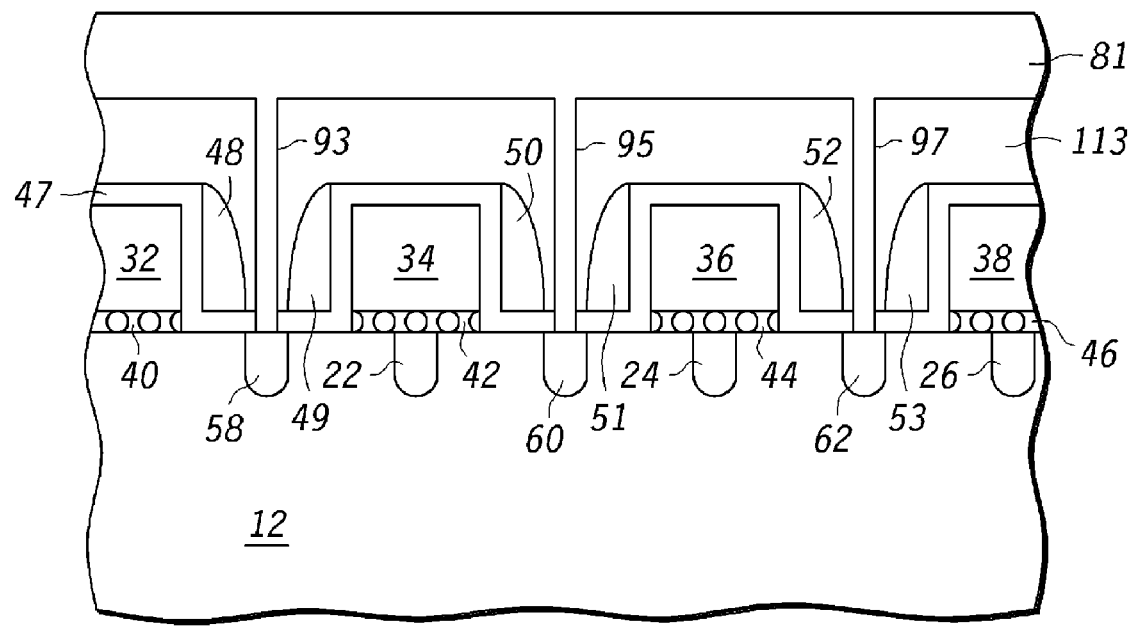
FIG. 11 is a cross section of the storage device structure of FIG. 10 at a subsequent stage in processing.

Illustrated in FIG. 11 is storage device structure 10 after formation of a blanket insulating or dielectric layer 113. The dielectric layer 113 is formed as a composite layer having a plurality of layers of insulative material. For example, multiple deposition steps are performed to result in a plurality of discrete insulating layers. After the formation of dielectric layer 113, the dielectric layer 113 is etched to form contact vias in a conventional manner. Conductive contacts 93, 95 and 97 are formed within the dielectric layer 113 to make direct electrical contact to the doped regions 58, 60 and 62. Overlying the dielectric layer 113 is a conductive layer forming a row source line 81. The conductive layer or strip of row source line 81 is formed, in one form, as a blanket deposition and is then patterned to overlie the conductive contacts 93, 95 and 97 and routed as necessary. The row source line 81 is formed typically by deposition of a conductive material such as metal. It should be understood that any conductive material, such as polysilicon, may be used for row source line 81.

At this point in the processing there has been formed a functional storage device structure 10. The storage device structure 10 of FIG. 11 implements a plurality of memory cells that are positioned closely in an efficient manner. For example, a first memory cell is formed of control gate 34, a select gate from conductive spacer 50, a drain from doped region 22 and a source from doped region 60. An adjoining second memory cell is formed of control gate 34, select gate formed by conductive spacer 49, a drain from doped region 22 and a source from doped region 58. Each control gate is associated with two memory cells. This structure enables a write or programming current of the memory cell to be reduced because of an enhanced vertical electron injection field that exists within the channel of the storage device structure 10. In particular, electrons are directed into the storage layer 42 at the peripheral edge closest to an associated source. Because the electrons are immediately directed into the storage layer 42 as they move laterally from the source into the channel, the efficiency of charge transfer into the storage layer 42 is increased. As a result, as lower amount of programming is required to charge the storage layer 42 and enhanced operation is obtained. Further the close positioning of two memory cells with one control gate permits efficient scaling to smaller geometries. By using a buried diffusion region, such as the doped region 22 underlying the control gate 34, efficient space utilization occurs.

Figure 12:
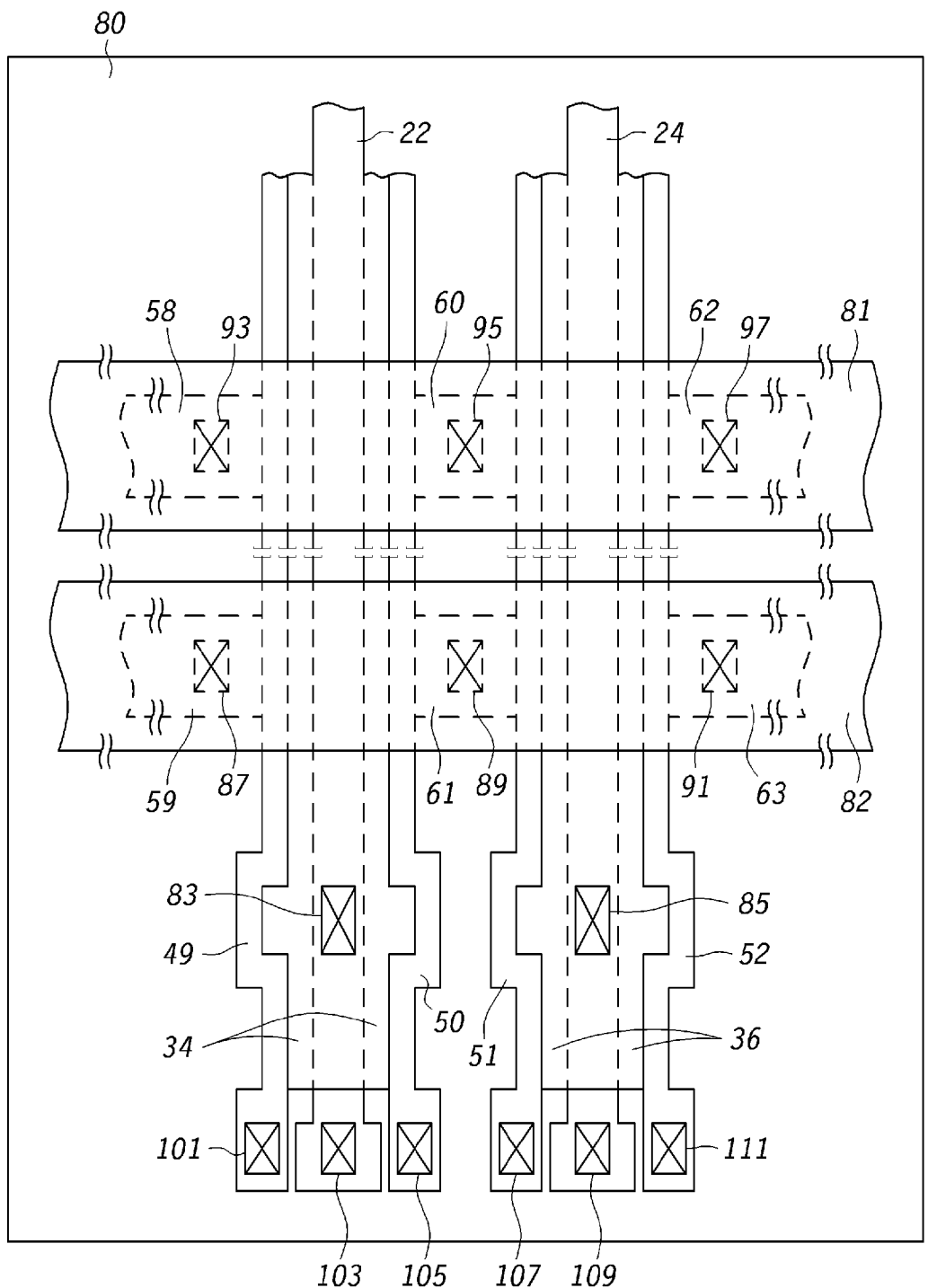
FIG. 12 is a top plan view of the storage device structure of FIG. 11.

Illustrated in FIG. 12 is a top plan view of a virtual ground array area 80 containing the storage device structure 10 of FIG. 11. For purposes of explanation, common reference elements that have previously been discussed are similarly numbered in FIG. 12 and are not necessarily further detailed where the relationship with other elements is apparent. Two row source lines 81 and 82 are illustrated extending in parallel and overlying multiple memory cells. The row source lines 81 and 82 are conductive and are typically metal. Intersecting and substantially perpendicular to the row source lines 81 and 82 are control gates 34 and 36 and drain formed by doped regions 22 and 24. Row source line 81 overlies the sources formed by doped regions 58, 60 and 62. Similarly, row source line 82 overlies the sources formed by doped regions 59, 61 and 63. A contact 93 to the source formed by doped region 58 underlies the row source line 81. A contact 95 to source diffusion 60 underlies the row source line 81. A conductive contact 97 to a source formed by a doped region 62 underlies the row source line 81. Similarly, a contact 87 to a source formed by a doped region 59 underlies the row source line 82. A contact 89 to a source formed by a doped region 61 underlies the row source line 82. Further, a contact 91 to a source formed by a doped region 63 underlies the row source line 82. A contact 83 makes electrical contact to control gate 34. Similarly, a contact 85 makes electrical contact to control gate 36. Contacts 101, 103 and 105 respectively make electrical contact to the select gate of conductive spacer 49, the drain at doped region 22 and the select gate formed by conductive spacer 50. Similarly, contacts 107, 109 and 111 respectively make electrical contact to the select gate formed by conductive spacer 51, the drain at doped region 24 and the select gate formed by conductive spacer 52.

By now it should be appreciated that there has been provided a method for forming a storage device and the storage device having conductive spacers that function as control gates to implement two memory cells with a common source/drain diffusion. First and second doped regions are formed within a substrate and on opposite sides of a region of sacrificial material. A discrete charge storage layer is formed overlying a substrate and between regions of the sacrificial material. A first conductive control electrode and a second conductive control electrode overlie the substrate and are on opposite sides of one of the regions of the sacrificial material. A first pair of select electrodes are formed along the two sides of the first conductive control electrode and a second pair of select electrodes are formed the two sides of the second conductive control electrode. A third doped region is formed in the substrate between the first and second conductive control electrodes and functions as either a drain or a source, depending upon the conductivity type.

The storage devices described herein may be implemented as various types of nonvolatile memory devices. One exemplary implementation of the storage devices taught herein is as a Flash memory. By placing a source/drain diffusion below a select gate, a high density Flash memory may be implemented. The high density Flash memory that is realizable using the storage device described herein permits a compact source-side injection based memory. As a result, more bits of data may be stored in a same amount of area than conventional known memory structures.

In one form there is herein provided a method for forming a storage device structure. A substrate of a first conductivity type is provided. Overlying regions of sacrificial material are formed. A first doped region of a second conductivity type opposite the first conductivity type and a second doped region of the second conductivity type is formed within the substrate and on opposite sides of one of the regions of sacrificial material. A discrete charge storage layer is formed overlying the substrate and between the regions of the sacrificial material. A first conductive control electrode and a second conductive control electrode are formed overlying the substrate and on opposite sides of the one of the regions of sacrificial material, the first and second conductive control electrodes each having a top surface and two sides. A first pair of select electrodes is formed along the two sides of the first conductive control electrode and a second pair of select electrodes is formed along the two sides of the second conductive control electrode. A third doped region of the second conductivity type is formed in the substrate between the first and second conductive control electrodes. The first pair of select electrodes is formed by depositing a layer of polysilicon and anisotropically etching the layer of polysilicon to leave polysilicon sidewall spacers as the first pair of select electrodes. The third doped region is formed by performing an implant using the polysilicon sidewall spacers as a mask. A metal layer is formed over the first and second conductive control electrodes and the third doped region. A contact is formed between the third doped region and the metal layer. In one form nitride is used as the sacrificial material. In another form the discrete charge storage layer overlying the substrate between the sacrificial material is formed by depositing a layer of nanoclusters and removing portions of the layer that are not underlying the first conductive control electrode and the second conductive control electrode.

In yet another form a method for forming a storage device structure includes providing a semiconductor substrate, forming a first plurality of spaced apart doped regions in the substrate, and forming a plurality of spaced apart storage regions over the first plurality of doped regions, forming a plurality of spaced apart first electrodes over the plurality of storage regions. First sidewall spacers are formed on sidewalls of the plurality of spaced apart first electrodes, wherein the first sidewall spacers comprise one of a group consisting of a material that can be doped to become conductive and a material that is conductive. Dopants are implanted using the first sidewall spacers as a mask to form a second plurality of spaced apart doped regions in the substrate.

In another form metal layers are formed over the second plurality of spaced apart doped regions. Contacts are formed between the metal layers and the second plurality of spaced apart doped regions. In yet another form the plurality of spaced apart first electrodes are characterized as control gates and the first sidewall spacers are characterized as select gates. In another form the first plurality of doped regions is formed by forming spaced apart sacrificial layers over the substrate, wherein the spaced apart sacrificial layers have sidewalls. Second sidewall spacers are formed on the sidewalls of the sacrificial layers. An implant is made into the substrate using the sacrificial layers and the second sidewall spacers as a mask.

In yet another form the first sidewall spacers are formed by forming a conformal layer over the plurality of spaced apart first electrodes, wherein the conformal layer comprises one of the group consisting of a material that can be doped to become conductive and a material that is conductive. The conformal layer is anisotropically etched to leave the first sidewall spacers on the sidewalls of the plurality of spaced apart first electrodes. In another form the conformal layer is characterized as comprising polysilicon.

In yet another form there is provided a storage device structure. A substrate is provided having a first doped region and a second doped region in the substrate. A first storage layer overlies the first doped region. A second storage layer overlies the second doped region. A first control gate is over the first storage layer and has a first sidewall and a second sidewall. A second control gate is over the second storage layer and has a first sidewall and a second sidewall. A first select gate is on the first sidewall of the first control gate and a second select gate is on the second sidewall of the first control gate. A third select gate is on the first sidewall of the second control gate. A fourth select gate is on the second sidewall of the second control gate. A third doped region in the substrate is between the second and third select gates. In one form a metal layer overlies the first and second control gates and the third doped region. A contact is between the third doped region and the metal layer. A dielectric layer is formed over the first and second control gates prior to forming the metal layer. A contact opening is formed through the dielectric layer to the third doped region. In one form the first and second storage layers are formed of nanoclusters. In another form the first, second, third, and fourth select gates are polysilicon. In another form the substrate is of a first conductivity type and the first, second, and third doped regions are of a second conductivity type. In yet another form the third doped region is substantially aligned to the second and third select gates. In another form the third doped region extends slightly under the second and third select gates.

Various changes and modifications to the embodiments herein chosen for purposes of illustration will readily occur to those skilled in the art. For example, hot carrier injection (HCI) can be also used in conjunction with the source side injection to cause programming at interior portions of the storage layer 42 at both a left side and a right side close to doped region 22. By injecting electrons in the central area of the storage layer 42 using HCI and injecting electrons at the lateral outside edge of storage layer 42 using SSI, two bits of information may be programmed per memory cell.

While these embodiments have been shown using a bulk silicon substrate but another substrate type, such as semiconductor on insulator (SOI) or SOI hybrid, could also be used. To the extent that such modifications and variations do not depart from the spirit of the invention, they are intended to be included within the scope thereof which is assessed only by a fair interpretation of the following claims.

What is claimed is:

1. A storage device structure comprising:
   a substrate;
   a first doped region in the substrate;
   a second doped region in the substrate;
   a first storage layer overlying the first doped region;
   a second storage layer overlying the second doped region;
   a first control gate over the first storage layer and having a first sidewall and a second sidewall;
   a second control gate over the second storage layer and having a first sidewall and a second sidewall,
   a first select gate on the first sidewall of the first control gate;
   a second select gate on the second sidewall of the first control gate;
   a third select gate on the first sidewall of the second control gate;
   a fourth select gate on the second sidewall of the second control gate; and
   a third doped region in the substrate between the second and third select gates.

2. The storage device structure of claim 1 further comprising:
   a metal layer overlying the first and second control gates and the third doped region; and
   a contact between the third doped region and the metal layer.

3. The storage device structure of claim 2, further comprising:
   a dielectric layer over the first and second control gates; and
   a contact opening through the dielectric layer to the third doped region.

4. The storage device structure of claim 1, wherein the first and second storage layers comprise nanoclusters.

5. The storage device structure of claim 1, wherein the first, second, third, and fourth select gates comprise polysilicon.

6. The storage device structure of claim 1, wherein the substrate is of a first conductivity type and the first, second, and third doped regions are of a second conductivity type.

7. The storage device structure of claim 1, wherein the third doped region is substantially aligned to the second and third select gates.

8. The storage device structure of claim 1, wherein the third doped region extends slightly under the second and third select gates.

9. A storage device structure comprising:
   a substrate;
   a first doped region in the substrate;
   a second doped region in the substrate;
   a first nitride film storage layer overlying the first doped region;
   a second nitride film storage layer overlying the second doped region;
   a first control gate over the first nitride film storage layer and having a first sidewall and a second sidewall;
   a second control gate over the second nitride film storage layer and having a first sidewall and a second sidewall;
   a first select gate on the first sidewall of the first control gate;
   a second select gate on the second sidewall of the first control gate;
   a third select gate on the first sidewall of the second control gate;
   a fourth select gate on the second sidewall of the second control gate; and
   a third doped region in the substrate between the second and third select gates.

10. The storage device structure of claim 9 further comprising:
    a metal layer overlying the first and second control gates and the third doped region; and
    a contact between the third doped region and the metal layer.

11. The storage device structure of claim 9, further comprising:
    a dielectric layer over the first and second control gates; and
    a contact opening through the dielectric layer to the third doped region.

12. The storage device structure of claim 9, wherein the first, second, third, and fourth select gates comprise polysilicon.

13. The storage device structure of claim 9, wherein the substrate is of a first conductivity type and the first, second, and third doped regions are of a second conductivity type.

14. The storage device structure of claim 9, wherein the third doped region is substantially aligned to the second and third select gates.

15. The storage device structure of claim 9, wherein the third doped region extends slightly under the second and third select gates.

16. A storage device structure comprising:
   a substrate;
   a first doped region in the substrate;
   a second doped region in the substrate;
   a first storage layer overlying the first doped region;
   a second storage layer overlying the second doped region;
   a first control gate over the first storage layer and having a first sidewall and a second sidewall;
   a second control gate over the second storage layer and having a first sidewall and a second sidewall;
   an insulating liner surrounding the first control gate and the second control gate;
   a first select gate on the insulating liner adjacent the first sidewall of the first control gate;
   a second select gate on the insulating liner adjacent the second sidewall of the first control gate;
   a third select gate on the insulating liner adjacent the first sidewall of the second control gate;
   a fourth select gate on the insulating liner and adjacent the second sidewall of the second control gate; and
   a third doped region in the substrate between the second and third select gates.

17. The storage device structure of claim 16 further comprising:
   a metal layer overlying the first and second control gates and the third doped region; and
   a contact between the third doped region and the metal layer.

18. The storage device structure of claim 16, further comprising:
   a dielectric layer over the first and second control gates; and
   a contact opening through the dielectric layer to the third doped region.

19. The storage device structure of claim 16, wherein the third doped region is substantially aligned to the second and third select gates.

20. The storage device structure of claim 16, wherein the third doped region extends slightly under the second and third select gates.

* * * * *